United States Patent
Roh

(10) Patent No.: US 10,510,746 B2
(45) Date of Patent: Dec. 17, 2019

(54) SEMICONDUCTOR DEVICE INCLUDING ELECTROSTATIC DISCHARGE PROTECTION PATTERNS

(71) Applicant: Samsung Electronics Co., Ltd., Suwon-si, Gyeonggi-do (KR)

(72) Inventor: Junghyun Roh, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/001,273

(22) Filed: Jun. 6, 2018

(65) Prior Publication Data

US 2019/0096875 A1 Mar. 28, 2019

(30) Foreign Application Priority Data

Sep. 28, 2017 (KR) .................. 10-2017-0126229

(51) Int. Cl.
| | |
|---|---|
| *H01L 27/02* | (2006.01) |
| *H01L 23/528* | (2006.01) |
| *H01L 23/522* | (2006.01) |
| *H01L 23/525* | (2006.01) |

(52) U.S. Cl.
CPC ........ *H01L 27/0292* (2013.01); *H01L 23/528* (2013.01); *H01L 23/5226* (2013.01); *H01L 23/5256* (2013.01); *H01L 27/0248* (2013.01)

(58) Field of Classification Search
CPC ............. H01L 27/0292; H01L 27/0248; H01L 2251/5392; H01L 23/5256; H01L 23/528; H01L 23/5226; H05K 1/0259; H05K 9/0079; H02J 2007/0039
See application file for complete search history.

(56) References Cited

U.S. PATENT DOCUMENTS

| | | | |
|---|---|---|---|
| 6,034,433 A | 3/2000 | Beatty | |
| 6,670,677 B2* | 12/2003 | Choe | .............. H01L 21/6835 |
| | | | 257/355 |
| 7,105,917 B2 | 9/2006 | Cho et al. | |

(Continued)

FOREIGN PATENT DOCUMENTS

| | | |
|---|---|---|
| JP | 2011040692 | 2/2011 |
| JP | 2014062773 | 4/2014 |

(Continued)

*Primary Examiner* — Galina G Yushina
(74) *Attorney, Agent, or Firm* — Sughrue Mion, PLLC

(57) ABSTRACT

A semiconductor device can include a front-end-of-line region at least a portion of which is disposed on a substrate, where the front-end-of-line region can include an electrostatic discharge protection circuit and an integrated circuit electrically connected to the electrostatic discharge protection circuit. A back-end-of-line region can be on the front-end-of-line region and an electrostatic discharge protection pattern can be on a scribe region of the substrate. The electrostatic discharge protection pattern can include a lower pattern extending horizontally and a side cross-sectional surface defined by a height and a width of the lower pattern, where the side cross-sectional surface can be exposed through a side surface of the back-end-of-line region. A via can be electrically connected to the lower pattern and extend perpendicularly to the substrate and an upper pattern can be electrically connected to the via.

20 Claims, 16 Drawing Sheets

(56) References Cited

U.S. PATENT DOCUMENTS

| | | | |
|---|---|---|---|
| 8,049,249 B1* | 11/2011 | Cheng | H01L 23/60 |
| | | | 257/173 |
| 9,355,971 B1 | 5/2016 | Mallikarjunaswamy | |
| 9,524,938 B2 | 12/2016 | Do et al. | |
| 9,632,109 B2 | 4/2017 | Dibattista et al. | |
| 2008/0048226 A1* | 2/2008 | Heo | H01L 27/11502 |
| | | | 257/295 |
| 2010/0123245 A1* | 5/2010 | Lee | H01L 27/0251 |
| | | | 257/737 |
| 2010/0200957 A1 | 8/2010 | Chandrasekaran | |
| 2012/0043643 A1* | 2/2012 | Chang | H01L 27/0259 |
| | | | 257/557 |
| 2012/0119208 A1 | 5/2012 | Shin | |
| 2012/0119300 A1 | 5/2012 | Kim et al. | |
| 2013/0009278 A1 | 1/2013 | Lee | |
| 2016/0064294 A1* | 3/2016 | Reber | H01L 24/02 |
| | | | 257/499 |
| 2017/0110160 A1 | 4/2017 | Seo et al. | |

FOREIGN PATENT DOCUMENTS

| | | |
|---|---|---|
| JP | 2014163952 | 9/2014 |
| JP | 2016100589 | 5/2016 |
| JP | 2016164942 | 9/2016 |
| KR | 10-2013-0070124 A | 6/2013 |

\* cited by examiner

SEMICONDUCTOR DEVICE INCLUDING ELECTROSTATIC DISCHARGE PROTECTION PATTERNS

CROSS-REFERENCE TO RELATED APPLICATIONS

This U.S. non-provisional patent application claims priority under 35 U.S.C § 119 of Korean Patent Application No. 10-2017-0126229 filed on Sep. 28, 2017, the entire contents of which are hereby incorporated by reference.

BACKGROUND

The present inventive concept relates to semiconductor devices, and more particularly, to electrostatic discharge protection of semiconductor devices.

Semiconductor devices may suffer from undesirable electrostatic discharge events during manufacturing or use. As electrostatic discharge events may deteriorate the electrical characteristics of semiconductor devices, those devices can include protection from electrostatic discharge events.

SUMMARY

Embodiments of inventive concepts can provide a semiconductor device including electrostatic discharge protection patterns and method of forming the same. Pursuant to these embodiments, a semiconductor device can include a front-end-of-line region at least a portion of which is disposed on a substrate, where the front-end-of-line region can include an electrostatic discharge protection circuit and an integrated circuit electrically connected to the electrostatic discharge protection circuit. A back-end-of-line region can be on the front-end-of-line region and an electrostatic discharge protection pattern can be on a scribe region of the substrate. The electrostatic discharge protection pattern can include a lower pattern extending horizontally and a side cross-sectional surface defined by a height and a width of the lower pattern, where the side cross-sectional surface can be exposed through a side surface of the back-end-of-line region. A via can be electrically connected to the lower pattern and extend perpendicularly to the substrate and an upper pattern can be electrically connected to the via.

In some embodiments, a semiconductor device can include a semiconductor integrated circuit at least a portion of which is disposed on a substrate where an electrical connection region can be on the semiconductor integrated circuit and have a side surface in a scribe region of the substrate, where the side surface can be coplanar with a side surface of the substrate. An electrical protection pattern can be disposed in a side portion of the electrical connection region, where the electrical protection pattern can include a lower pattern extending along the substrate and can include an exposed portion exposed through the side surface of the electrical connection region, a via electrically can be connected to the lower pattern and configured to be automatically ruptured by an electrical discharge greater than a specified charge associated with an electrical test voltage applied to the semiconductor integrated circuit, and an upper pattern electrically connected to the via and not exposed through the side surface of the electrical connection region.

In some embodiments, a method of forming a semiconductor device can include providing a semiconductor wafer including a plurality of chip regions and a scribe lane that separates the plurality of chip regions from each other. A test signal input structure can be formed on the scribe lane, where the test signal input structure can include a central well-shaped portion that is recessed toward the semiconductor wafer, and the test signal input structure can be spaced from the semiconductor wafer. The semiconductor wafer can be diced into a plurality of semiconductor chips to transform the central well-shaped portion of the test signal input structure into a plurality of electrostatic discharge protection patterns each having an L shape partially exposed through a side surface of the semiconductor chip formed during the dicing.

DETAILED DESCRIPTION OF EMBODIMENTS

It will be hereinafter discussed in detail a semiconductor device and a method of manufacturing the same in conjunction with the accompanying drawings.

Figure 1A:
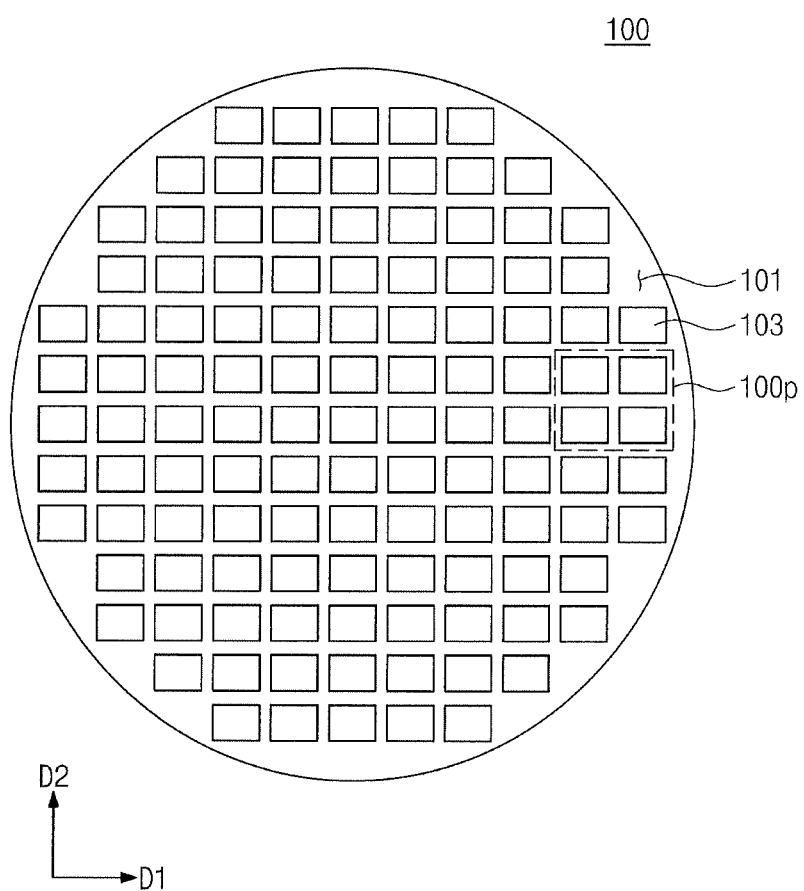
FIG. 1A is a plan view showing a semiconductor wafer according to exemplary embodiments of inventive concepts.
Figure 1B:
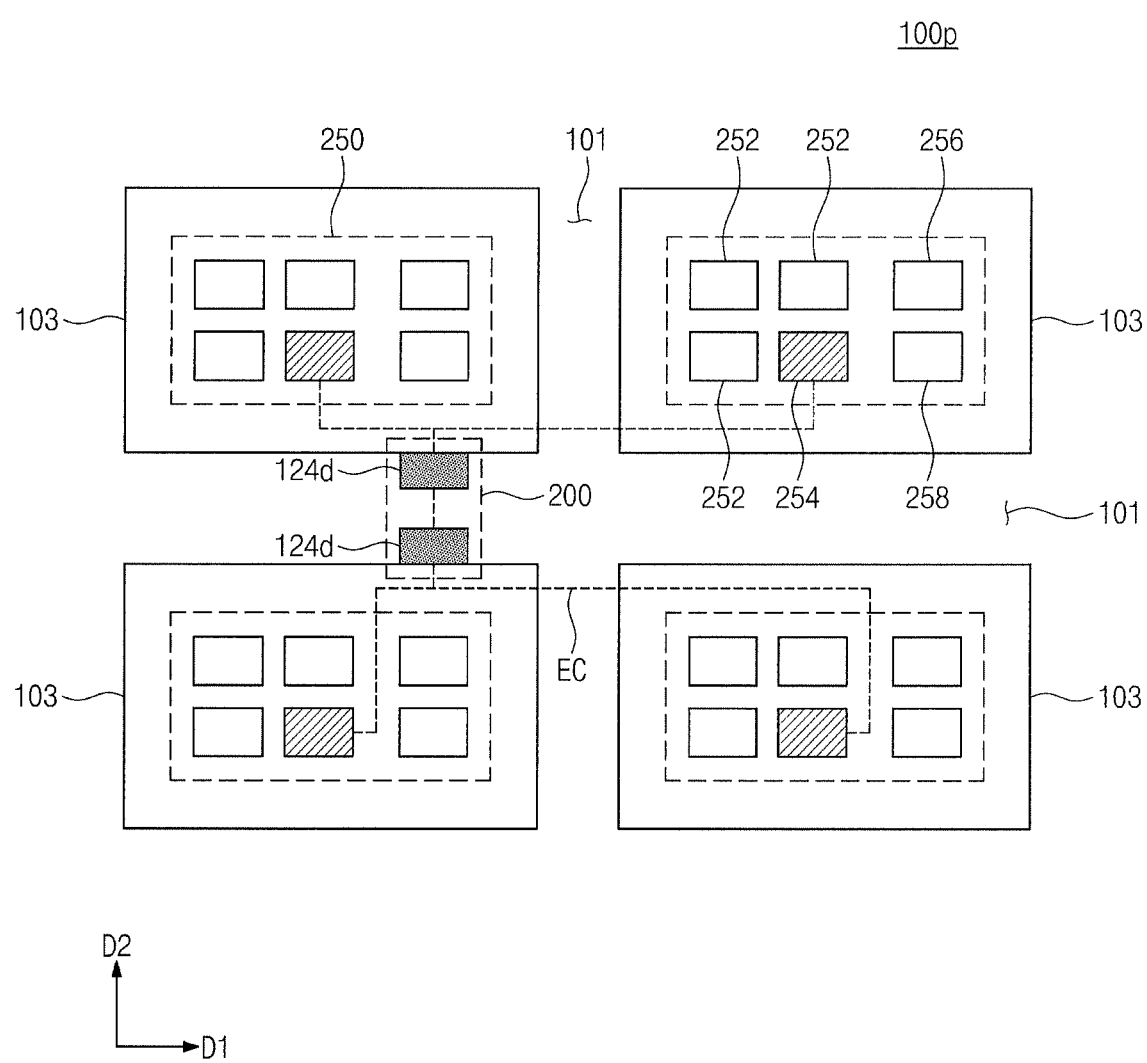
FIG. 1B is a plan view showing a portion of FIG. 1A.
Figure 1C:
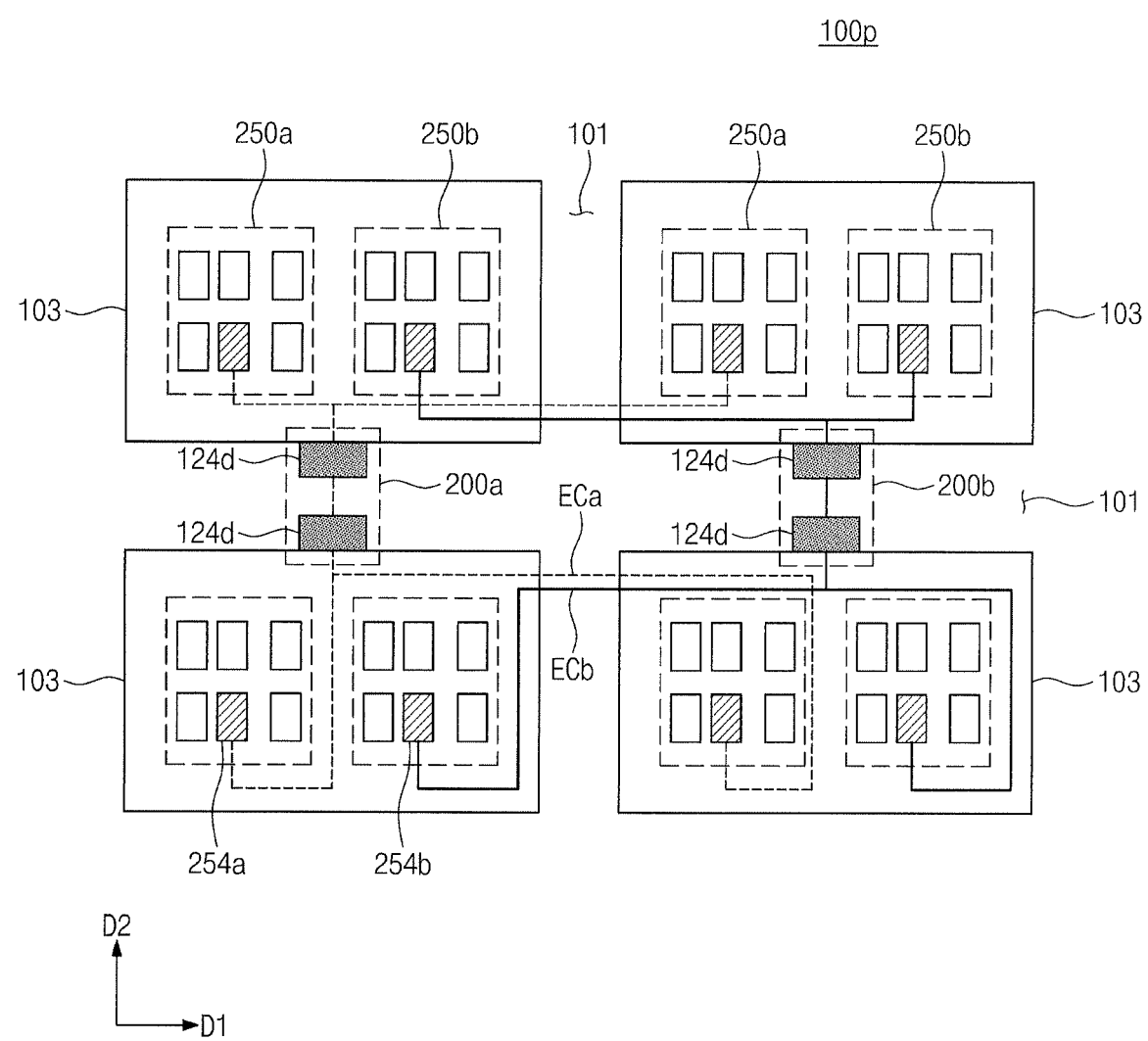
FIG. 1C is a plan view showing a portion of FIG. 1A.

FIG. 1A illustrates a plan view showing a semiconductor wafer according to exemplary embodiments of inventive concepts. FIGS. 1B and 1C illustrate plan views showing a portion of FIG. 1A.

Referring to FIG. 1A, a semiconductor wafer 100 may be provided. The semiconductor wafer 100 may include, for example, a silicon wafer. The semiconductor wafer 100 may include a plurality of chip regions 103 two-dimensionally arranged along a first direction D and a second direction D2. The first and second directions D1 and D2 may be substantially perpendicular to each other. The chip regions 103 may be spaced apart from each other by a grid-shaped scribe lane 101 extending along the first and second directions D and D2. The semiconductor wafer 100 will be further discussed hereinafter in detail with reference to FIGS. 1B and 1C showing a portion 100p of the semiconductor wafer 100.

Figure 2A:
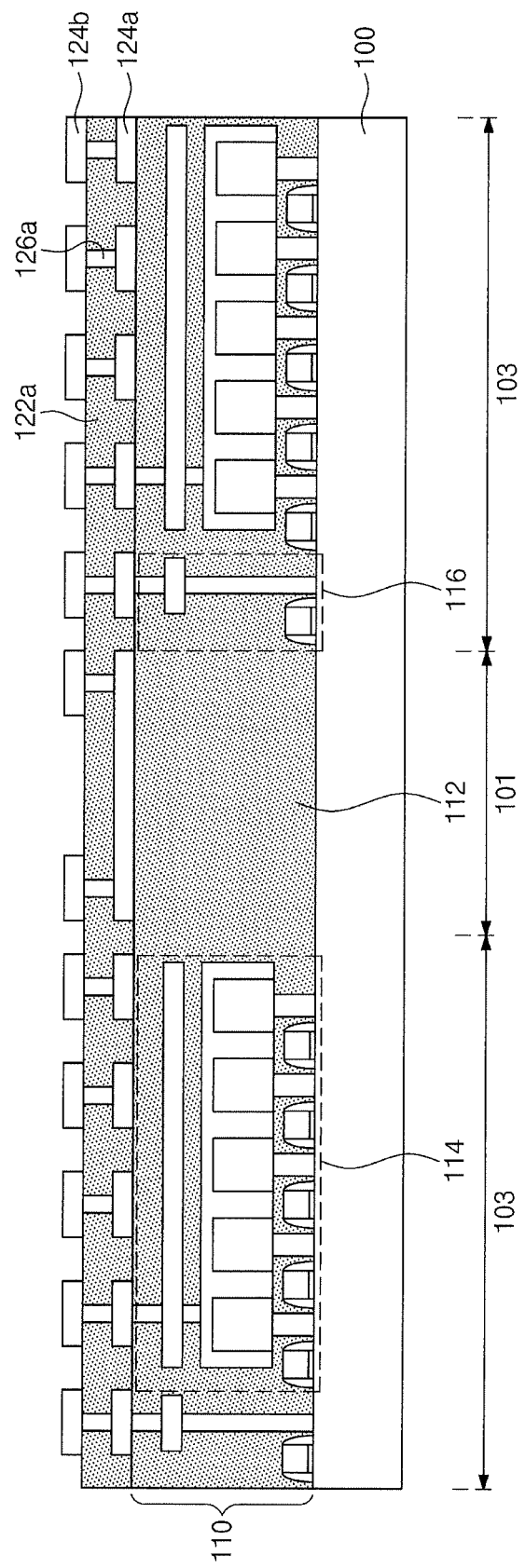
FIGS. 2A to 2D are cross-sectional views showing a method of manufacturing a semiconductor device according to exemplary embodiments of inventive concepts.

Referring to FIG. 1B, the chip region 103 may include a semiconductor integrated circuit (see 114 of FIG. 2A) and an electrostatic discharge protection circuit (see 116 of FIG. 2A). The chip region 103 may also include an electrical test circuit 250 provided on the circuits 114 and 116. The electrical test circuit 250 may include a plurality of output terminals 252, at least one input terminal 254, at least one power terminal 256, and at least one ground terminal 258. When the output terminals 252 output electrical signals for operation of the semiconductor integrated circuit 114 in response to a test voltage applied to the input terminal 254, the semiconductor integrated circuit 114 may be electrically tested to determine whether its operation is normal. The number, kind, and location of the terminals 252, 254, 256, and 258 provided in the electrical test circuit 250 are presented for the purpose of illustration only and are not intended to limit inventive concepts. The electrical test circuit 250 may include, for example, a merged die test (MDT) circuit.

In some embodiments, a probe of an external test apparatus may not contact the input terminal 254, but instead can contact a metal pattern 124d that is provided on the scribe lane 101 and electrically connected to the input terminal 254. One metal pattern 124d may be connected in common to a plurality of input terminals 254 provided on the chip regions 103 adjacent to each other. For example, one metal pattern 124d may be connected in common to two or more input terminals 254 provided on two or more chip regions 103 arranged along the first direction D1. Another metal pattern 124d, spaced apart from the one metal pattern 124d in the second direction D2 and provided on the scribe lane 101, may likewise be connected in common to other two or more input terminals 254 provided on other two or more chip regions 103 arranged along the first direction D1. FIG. 1B shows a dotted line EC representing an electrical connection, but not expressing an actual location of an electrical connection line.

A pair of metal patterns 124d facing each other in the second direction D2 may be electrically connected to each other to constitute a test signal input structure 200 which will be discussed below. In some embodiments, one test signal input structure 200 may be electrically connected to a plurality of chip regions 103. A probe may contact at least one metal pattern 124d included in the test signal input structure 200, and a test voltage may be applied through the probe to the at least one metal pattern 124d, thereby performing an electrical test on the plurality of chip regions 103. Though the electrical test is performed only once, the plurality of chip regions 103 may be simultaneously tested to determine if their respective operations are normal. The test signal input structure 200 may be provided on the scribe lane 101, and the number and location of the test signal input structure 200 may not be limited to that illustrated in FIG. 1B. In some embodiments, the test input structure 200, including the metal patterns 124d, is outside the chip regions 103.

Referring to FIG. 1C, one chip region 103 may be provided thereon with first and second electrical test circuits 250a and 250b. The first and second electrical test circuits 250a and 250b may be identically or similarly configured to the electrical test circuit 250 of FIG. 1B. First input terminals 254a included in the first electrical test circuit 250a provided on two or more chip regions 103 may be connected in common to a first test signal input structure 200a. Second input terminals 254b included in the second electrical test circuit 250b provided on two or more chip regions 103 may be connected in common to a second test signal input structure 200b. The first and second test signal input structures 200a and 200b may be identically or similarly configured to the test signal input structure 200 of FIG. 1B.

In some embodiments, the first and second test signal input structures 200a and 200b may be spaced apart from each other along the first direction D. The first and second test signal input structures 200a and 200b may be provided on the scribe lane 101, and locations of the first and second test signal input structures 200a and 200b may not be limited to that illustrated in FIG. 1C. FIG. 1C shows a dotted line ECa conceptually representing an electrical connection between the first input terminals 254a and the first test signal input structure 200a, and a solid line ECb conceptually representing an electrical connection between the second input terminals 254b and the second test signal input structure 200b.

Referring back to FIG. 1B, after the chip regions 103 are electrically tested using the test signal input structure 200, the semiconductor wafer 100 may experience a dicing process performed along the scribe lane 101. The dicing process may cut a physical and electrical connection between the metal patterns 124d, and may fabricate a plurality of semiconductor devices each including the chip region 103. Likewise, after an electrical test using the first and second test signal input structures 200a and 200b of FIG. 1C, the semiconductor wafer 100 may be diced to fabricate a plurality of semiconductor devices.

FIGS. 2A to 2D illustrate cross-sectional views showing a method of manufacturing a semiconductor device according to exemplary embodiments of inventive concepts. FIGS. 3A to 3D illustrate perspective views showing portions of FIGS. 2A to 2D, respectively.

Referring to FIG. 2A, a semiconductor wafer 100 such as a silicon wafer may be provided. The semiconductor wafer 100 may include chip regions 103 and a scribe lane 101 that separates the chip regions 103 from each other. A semiconductor integrated circuit 114 and an electrostatic discharge (ESD) protection circuit 116 may be formed on each of the chip regions 103. The semiconductor integrated circuit 114 may include a volatile memory circuit, a non-volatile memory circuit, a logic circuit, or a combination thereof. The ESD protection circuit 116 may include, for example, a charged device model (CDM) circuit. The semiconductor integrated circuit 114 and the ESD protection circuit 116 may be covered with an interlayer dielectric layer 112. The interlayer dielectric layer 112 may include a plurality of stacked insulating layers. Hereinafter, the semiconductor integrated circuit 114 and the ESD protection circuit 116 covered with the interlayer dielectric layer 112 may be collectively called a front-end-of-line (FEOL) region 110 for convenience of description.

A first intermetal dielectric layer 122a, first metal patterns 124a, and first metal vias 126a may be formed on the FEOL region 110. For example, photolithography and deposition processes may be performed to form the first metal patterns 124a on the interlayer dielectric layer 112, a deposition process may be performed to form the first intermetal dielectric layer 122a on the interlayer dielectric layer 112 covering the first metal patterns 124a, and photolithography and deposition processes may be performed to form the first metal vias 126a connected to the first metal patterns 124a. Second metal patterns 124b may be formed on the first intermetal dielectric layer 122a to contact the first metal vias 126a.

Figure 3A:
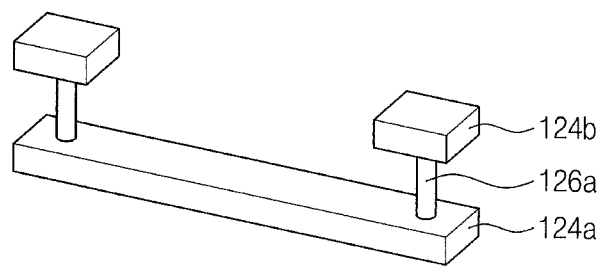
FIGS. 3A to 3D are perspective views showing portions of FIGS. 2A to 2D, respectively.

As illustrated in FIG. 3A, the scribe lane 101 may be provided thereon with at least a pair of first metal vias 126a, one line-shaped first metal pattern 124a electrically connecting the pair of first metal vias 126a to each other, and a pair of pad-shaped second metal patterns 124b connected to the pair of first metal vias 126a.

Figure 2B:
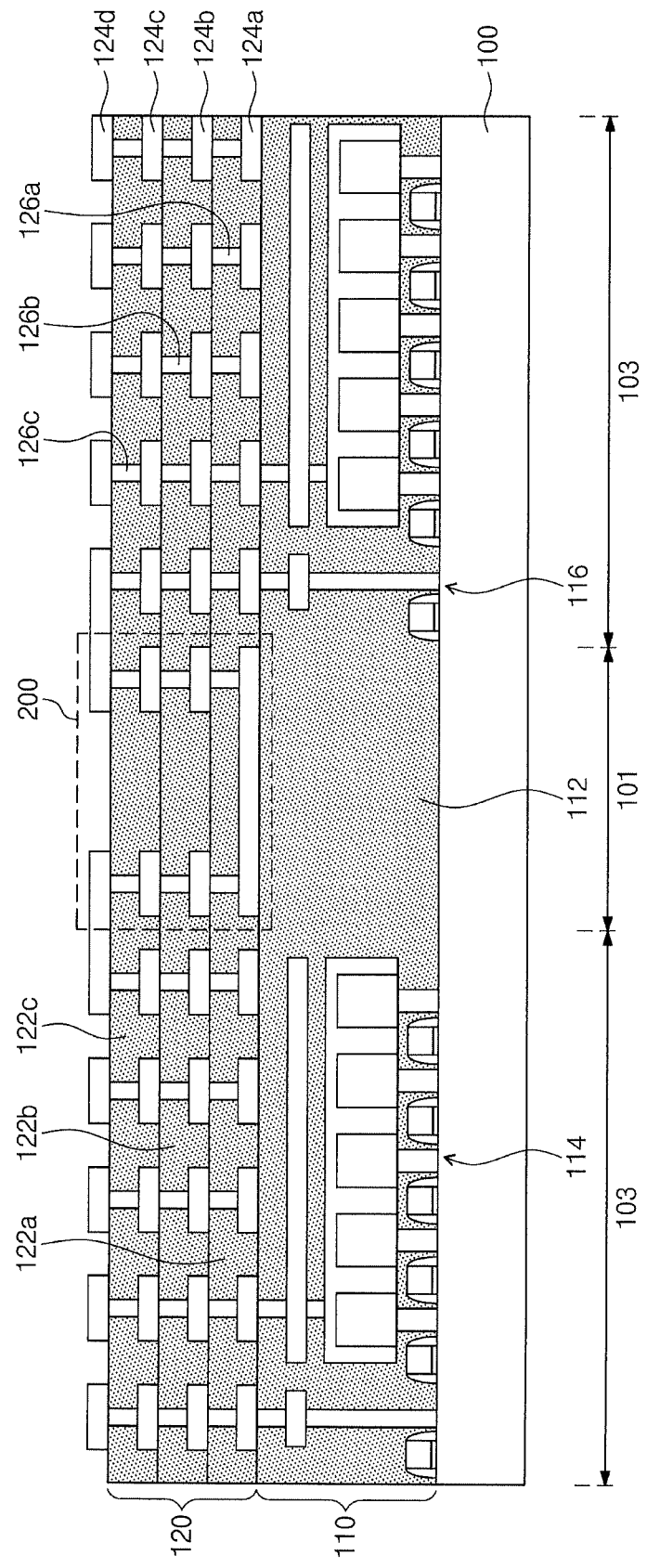

Referring to FIG. 2B, the photolithography and deposition processes discussed above with reference to FIG. 2A may be repeatedly performed to form a back-end-of-line (BEOL) region 120 on the FEOL region 110. The BEOL region 120 may include the first metal patterns 124a and the first metal vias 126a in the first intermetal dielectric layer 122a, second metal patterns 124b and second metal vias 126b in a second intermetal dielectric layer 122b, and third metal patterns 124c and third metal vias 126c in a third intermetal dielectric layer 122c. The BEOL region 120 may further include fourth metal patterns 124d provided on the third intermetal dielectric layer 122c and connected to the third metal vias 126c. The first to fourth metal patterns 124a to 124d may have linear and/or pad shapes, and the first to third metal vias 126a to 126c may have pillar shapes. In some embodiments, the second and third metal patterns 124b and 124c on the scribe lane 101 may have pad shapes, and the fourth metal patterns 124d on the scribe lane 101 may have linear or pad shapes.

The BEOL region 120 may be or correspond to an electrical connection region including metal lines that provide or receive electrical signals used to operate the circuits 114 and 116 of the FEOL region 110. The BEOL region 120 may be formed using a single or dual damascene process. In some embodiments, the processes used to form the BEOL region 120 may be employed to form a test signal input structure 200 on the scribe lane 101.

Figure 3B:
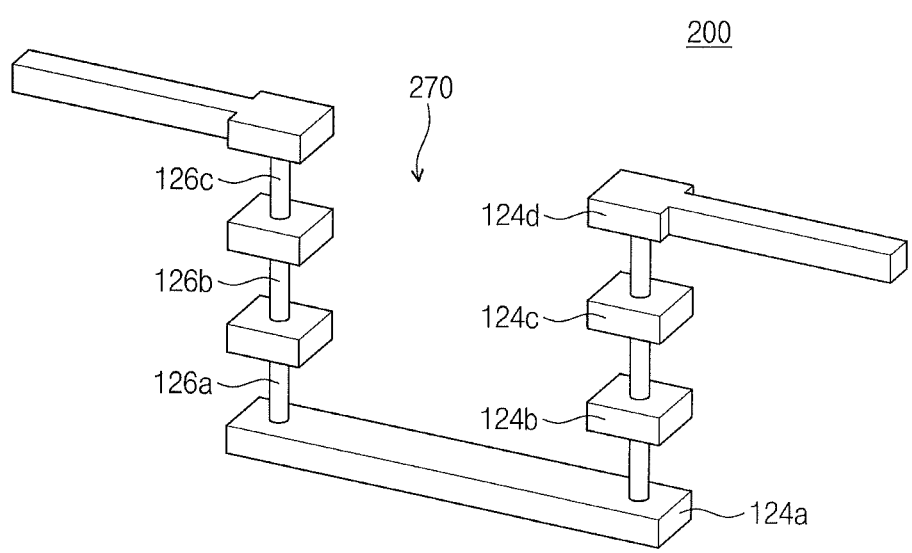

As illustrated in FIG. 3B, the test signal input structure 200 may include one line-shaped first metal pattern 124a extending along the semiconductor wafer 100, and the one line-shaped first metal pattern 124a may be provided on each of its opposite edges with one pillar-shaped first metal via 126a, one pad-shaped second metal pattern 124b, one pillar-shaped second metal via 126b, one pad-shaped third metal pattern 124c, one pillar-shaped third metal via 126c, and one line-shaped fourth metal pattern 124d extending along the semiconductor wafer 100. The fourth metal pattern 124d of the test signal input structure 200 may be or include a redistribution pattern. Alternatively, the fourth metal pattern 124d of the test signal input structure 200 may have a pad shape connected to other fourth metal pattern 124d redistributed on the third intermetal dielectric layer 122c outside the test signal input structure 200. The test signal input structure 200 may have a well shape whose central portion 270 is recessed.

Referring back to FIG. 2B, the test signal input structure 200 may be electrically connected to the ESD protection circuit 116 through at least one of the first to fourth metal patterns 124a to 124d formed on the BEOL region 120 and through at least one of the first to third metal vias 126a to 126c formed on the BEOL region 120. The ESD protection circuit 116 may be electrically connected to the semiconductor integrated circuit 114. In contrast, the test signal input structure 200 may have no physically and electrically direct connection with the semiconductor wafer 100. For example, the test signal input structure 200 may be physically spaced apart from the semiconductor wafer 100, and may be electrically connected to the semiconductor wafer 100 through the BEOL and FEOL regions 120 and 110.

After the BEOL region 120 is formed, the electrical test discussed with reference to FIGS. 1A to 1C may be executed. For example, a probe may contact at least one of the fourth metal patterns 124d of the test signal input structure 200, and a test voltage may be applied through the probe to the at least one fourth metal pattern 124d, and thus at the same time a plurality of semiconductor integrated circuits 114 may be electrically tested to determine whether their operations are normal.

Figure 2C:
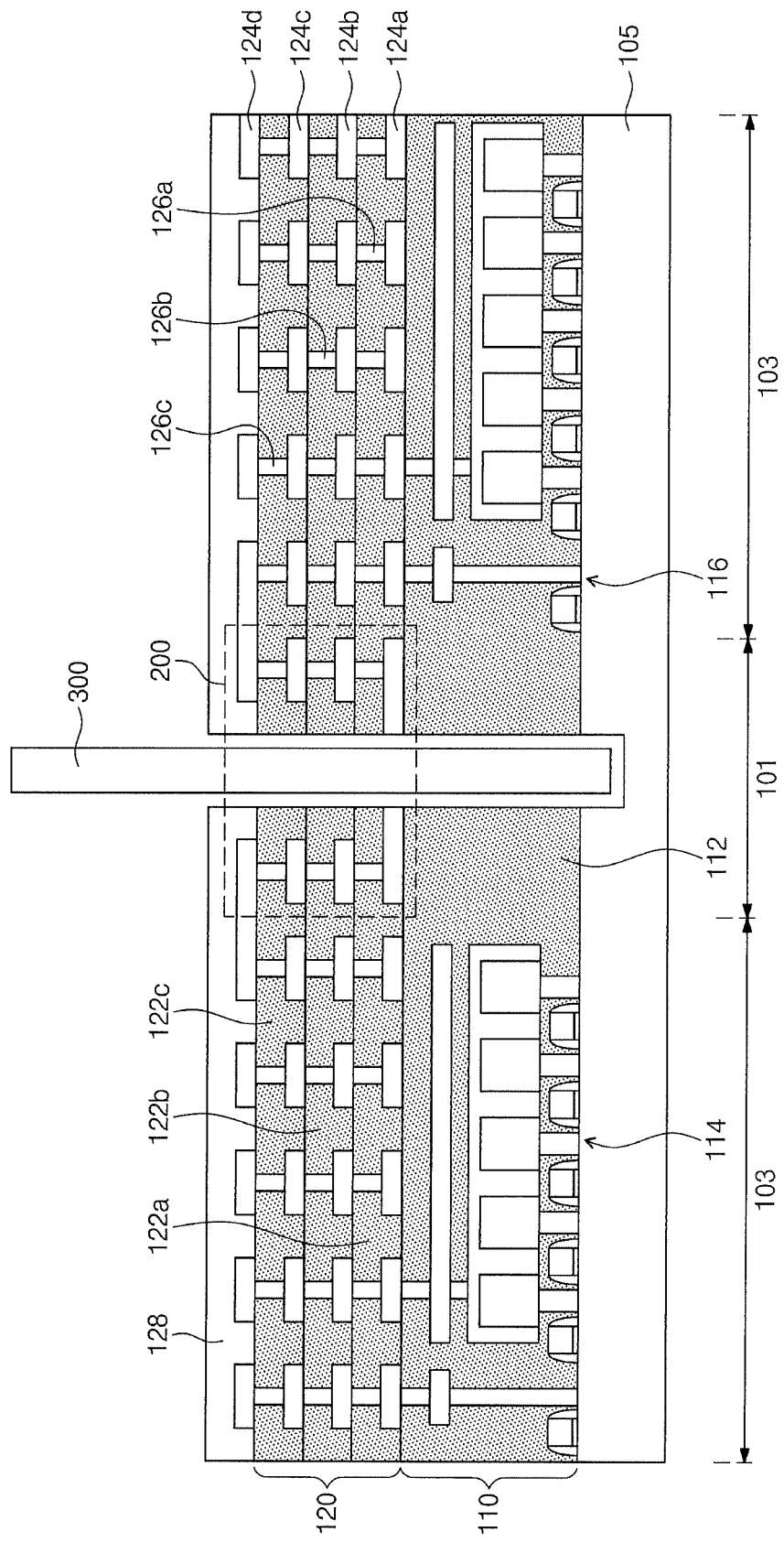
Figure 3C:
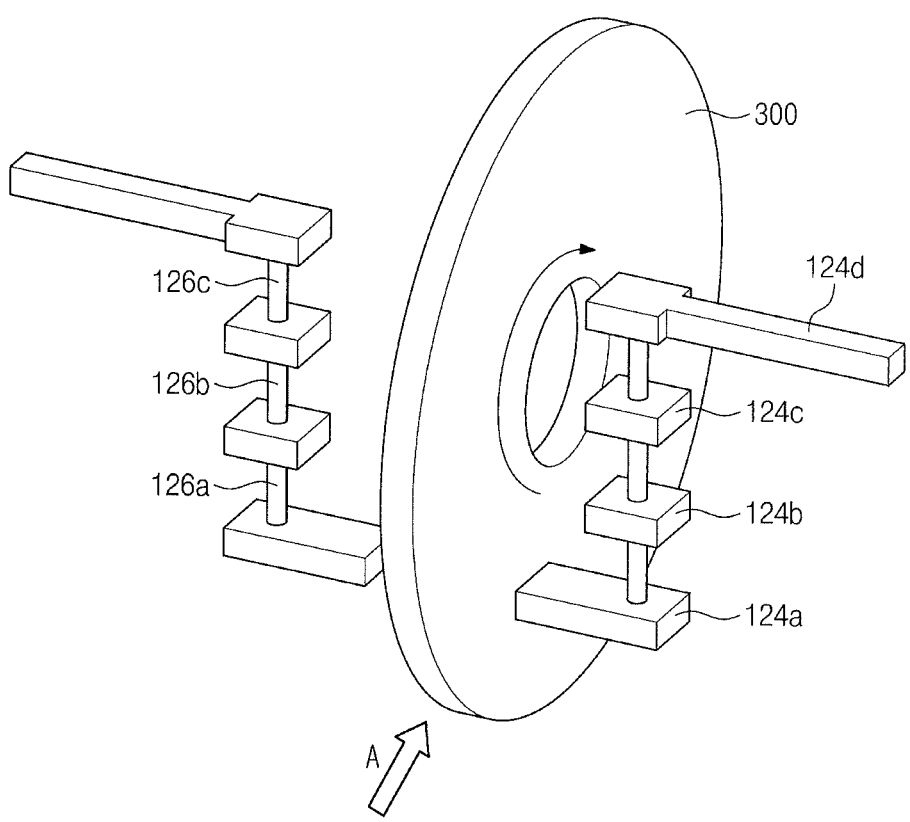

Referring to FIG. 2C, the semiconductor wafer 100 may experience a dicing process performed along the scribe lane 101. A cutting apparatus 300, such as blades or laser, may be used to cut the BEOL region 120, the FEOL region 110, and the semiconductor wafer 100 along the scribe lane 101. The test signal input structure 200 may have a well shape where, as illustrated in FIG. 3C, the first metal pattern 124a extends in a direction substantially perpendicular to a moving direction A of the cutting apparatus 300 and the first to third metal vias 126a to 126c are arranged perpendicularly to an extending direction of the first metal pattern 124a. In such a configuration, when the dicing process is performed while the cutting apparatus 300 rotates along the moving direction A, the first metal pattern 124a may be selectively cut into pieces. Before the dicing process is performed, a protection layer 128 may further be formed to cover the BEOL region 120. Alternatively, no protection layer 128 may be formed.

Figure 2D:
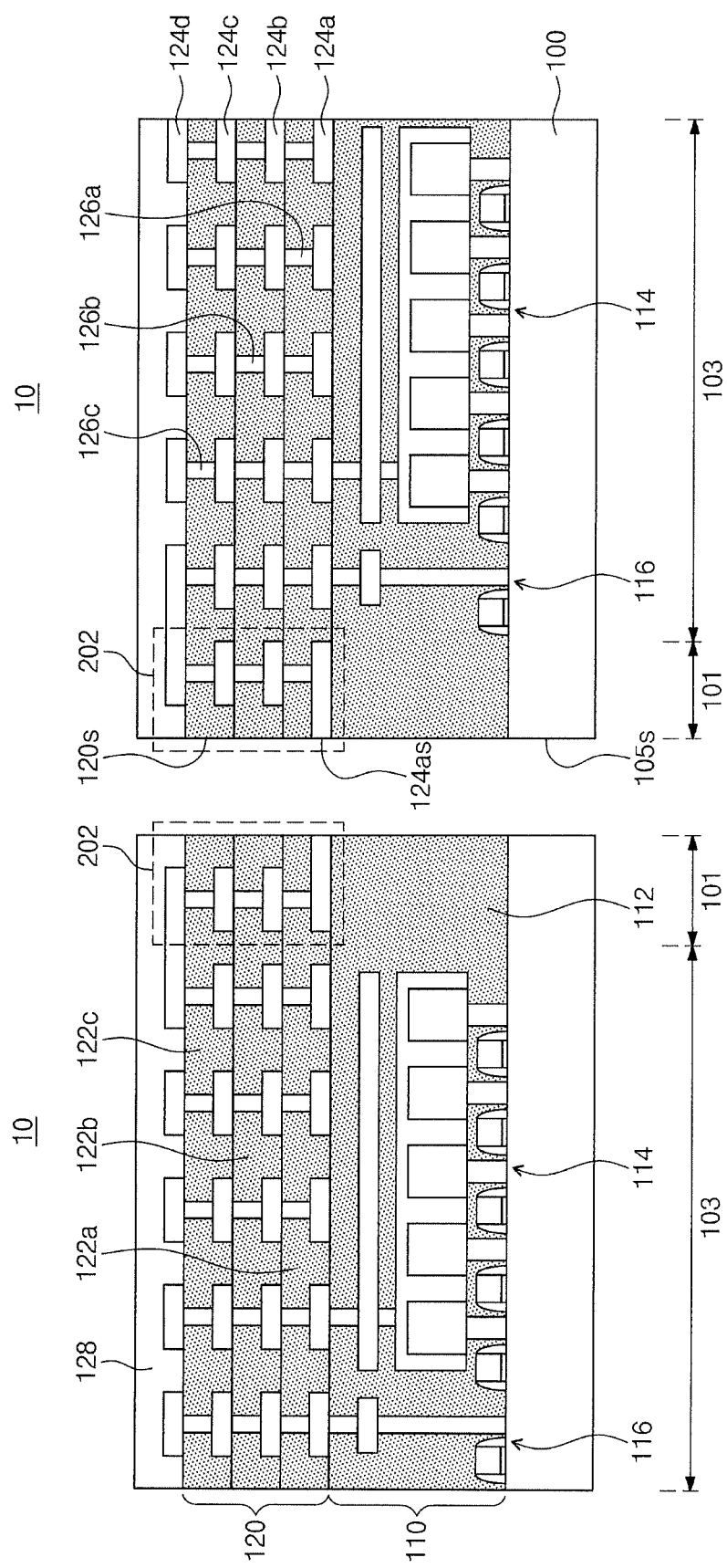

Referring to FIG. 2D, when the dicing process is terminated, the semiconductor wafer 100 may be divided into a plurality of chip-level wafers, or chip substrates 105. In addition, the dicing process may transform one test signal input structure 200 into a pair of electrostatic discharge (ESD) protection patterns 202. Through the processed mentioned above, a semiconductor device 10 may be fabricated to include the chip substrate 105 having thereon the FEOL region 110 including the semiconductor integrated circuit 114 and the ESD protection circuit 116, the BEOL region 120 stacked on the FEOL region 110, and the ESD protection pattern 202. The ESD protection pattern 202 may be provided within and at a side of the semiconductor device 10. Alternatively, as the number and location of the test signal input structure 200 are not limited as discussed in FIG. 1B, the semiconductor device 10 may be provided therein with two or more ESD protection patterns 202. In some embodiments, the semiconductor device 10 may include a portion of the scribe lane 101, and the ESD protection pattern 202 may be provided on the portion of the scribe lane 101.

The first metal pattern 124a of the ESD protection pattern 202 may have a side surface 124as exposed through a side surface 120s of the BEOL region 120. For example, the dicing process may cut the first metal pattern 124a, and thus the side surface 124as may be exposed. The side surface 124as of the first metal pattern 124a may be aligned with a side surface 105s of the chip substrate 105 in a direction perpendicular to the chip substrate 105. The side surface 124as of the first metal pattern 124a may be coplanar with the side surface 120s of the BEOL region 120 and the side surface 105s of the chip substrate 105. In contrast, the first to third metal vias 126a to 126c and the fourth metal pattern 124d of the ESD protection pattern 202 may be recessed beneath the side surface 120s of the BEOL region 120, thereby not being exposed through the side surface 120s of the BEOL region 120.

Figure 3D:
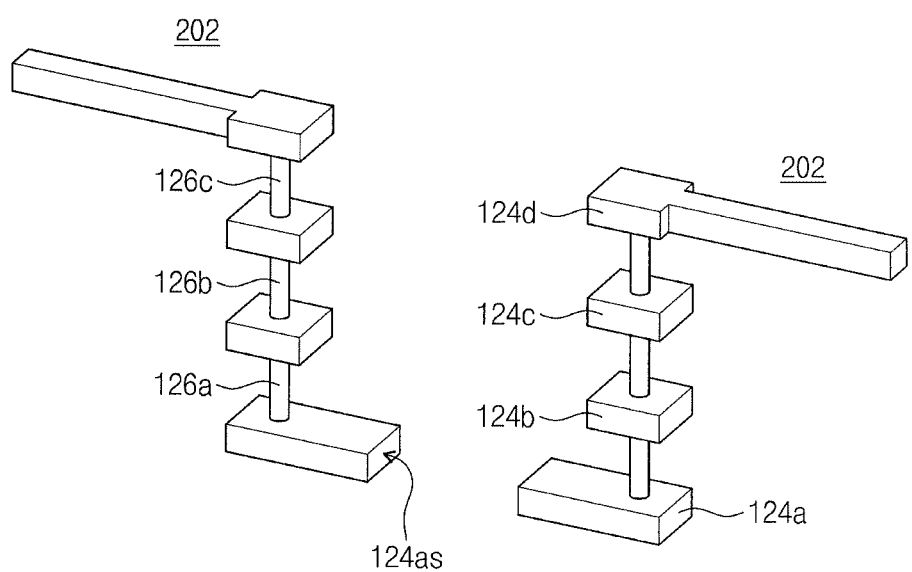

As illustrated in FIG. 3D, the ESD protection pattern 202 may have an L shape where the first metal pattern 124a, serving as a lower pattern of the ESD protection pattern 202, horizontally extends along the chip substrate 105 and the first to third metal vias 126a to 126c are perpendicularly aligned to the chip substrate 105. The first metal pattern 124a may have a linear shape extending toward the side surface 120s of the BEOL region 120.

The fourth metal pattern 124d serving as an upper pattern of the ESD protection pattern 202 may have a function as an input terminal with which a probe contacts when an electrical test is performed as discussed with reference to FIGS. 1A to 1C. The fourth metal pattern 124d may have a linear shape horizontally extending along the chip substrate 105. For example, the fourth metal pattern 124d may have a linear shape extending in a direction away from the side surface 120s of the BEOL region 120. Alternatively, the fourth metal pattern 124d may have a pad shape the same as or similar to that of the third metal pattern 124c. The pad-shaped fourth metal pattern 124d may be electrically connected to the fourth metal pattern 124d on the chip region 103 through a metal line or a redistribution pattern.

The first to third metal vias 126a to 126c of the ESD protection pattern 202 may have pillar shapes (e.g., cylinders) vertically extending along the side surface 120s of the BEOL region 120. The second and third metal patterns 124b and 124c serving as intermediate patterns of the ESD protection pattern 202 may have pad shapes. The first to third metal vias 126a to 126c may be substantially aligned with each other along a direction perpendicular to the chip substrate 105.

An electrostatic discharge may be introduced into the semiconductor device 10 through the exposed side surface 124as of the first metal pattern 124a. When an electrostatic discharge is introduced, as discussed below, the ESD protection pattern 202 may protect the semiconductor device 10 from the introduced electrostatic discharge.

Figure 4A:
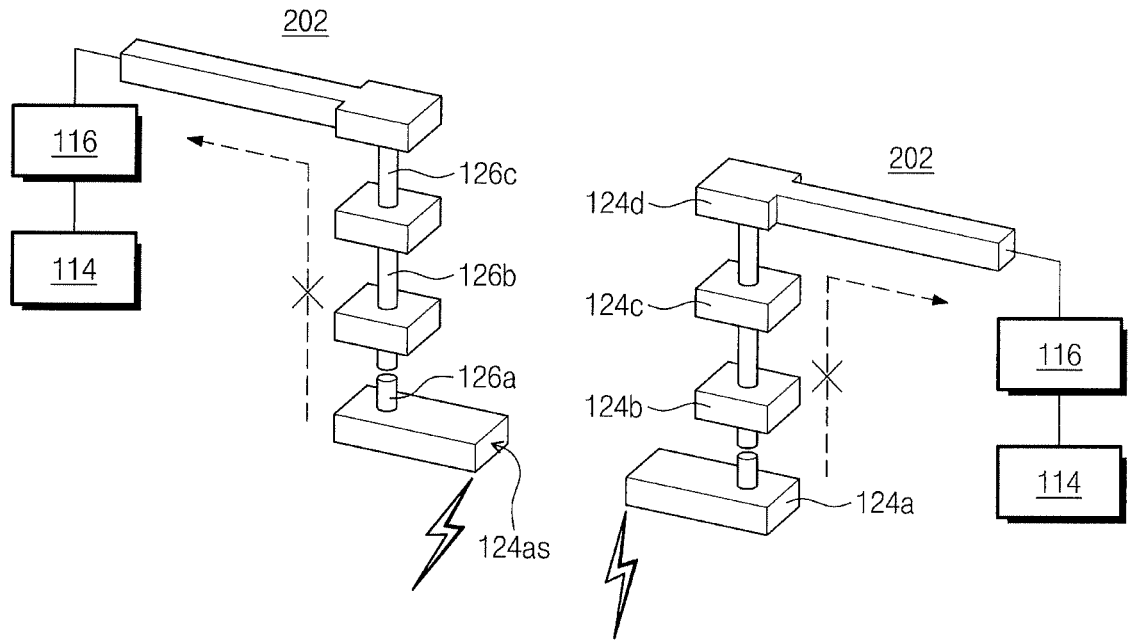
FIGS. 4A and 4B are schematic illustrations of structures protecting semiconductor devices from an electrostatic discharge according to exemplary embodiments of inventive concepts.
Figure 4B:
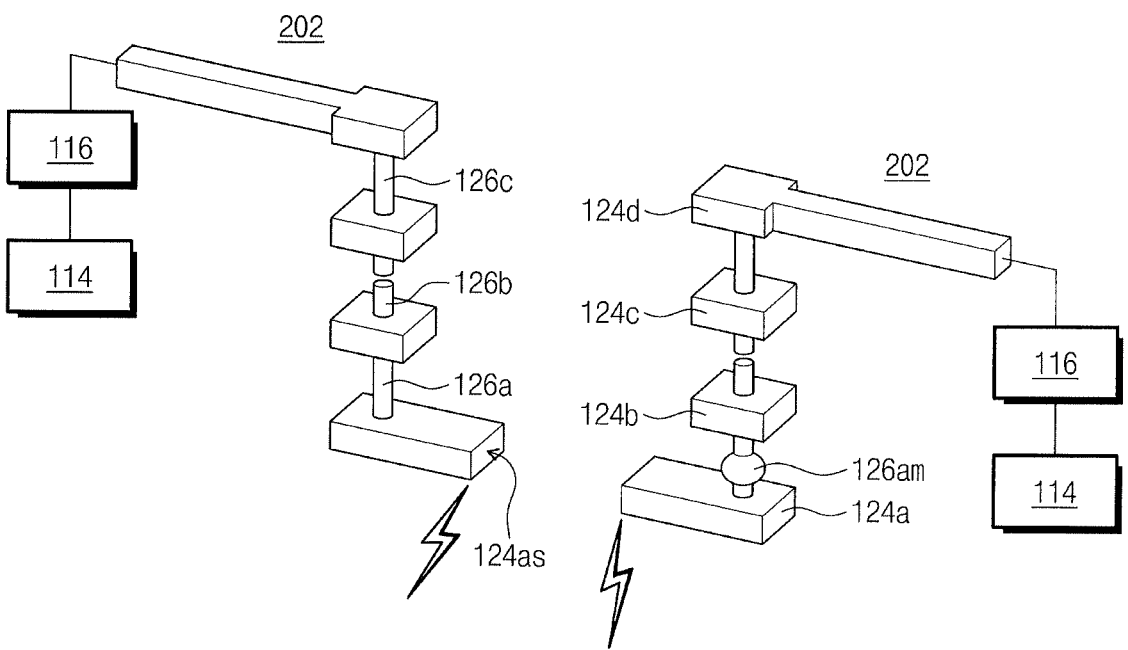

FIGS. 4A and 4B illustrate structures protecting semiconductor devices from an electrostatic discharge according to exemplary embodiments of inventive concepts.

Referring to FIG. 4A, an electrostatic discharge may undesirably occur during the dicing process as discussed above in FIG. 2C or in picking-up the semiconductor device 10 as discussed above in FIG. 2D. An electrostatic discharge may be introduced into the side surface 124as of the first metal pattern 124a and flow through the ESD protection pattern 202 to the ESD protection circuit 116. In some embodiments, the first to third metal vias 126a to 126c of the ESD protection pattern 202 may be or include self-bursting vias that endure a test voltage but automatically ruptured when receiving an electrostatic discharge greater than the test voltage. As used herein, the term "automatically" includes actions that occur without intervention of a circuit but rather occur as a result of a physical phenomenon.

For example, when the first to third metal vias 126a to 126c have cylindrical shapes, the first to third metal vias 126a to 126c may each have a diameter that can endure a test voltage/current or a lower voltage/current than the test voltage/current. When a higher electrostatic discharge (referred to hereinafter an over-current electrostatic discharge) than the test voltage/current is applied to the first metal pattern 124a, at least the first metal via 126a of the first to third metal vias 126a to 126c may be automatically ruptured. Accordingly, when the over-current electrostatic discharge is introduced into the ESD protection pattern 202, the first metal via 126a may be automatically ruptured to prevent the over-current electrostatic discharge from being transmitted to the semiconductor integrated circuit 114. In FIG. 4A, a dotted line indicates a path of the over-current electrostatic discharge, and in particular represents that the automatically ruptured first metal via 126a prevents the over-current electrostatic discharge from being transmitted to the ESD protection circuit 116. When the over-current electrostatic discharge is introduced into the ESD protection pattern 202, the first to third metal vias 126a to 126c may not be automatically ruptured. In this case, the ESD protection circuit 116 may operate to protect the semiconductor integrated circuit 114 from the over-current electrostatic discharge, such as when the magnitude of the over-current electrostatic discharge is too small to rupture the first to third metal vias 126a to 126c.

Referring to FIG. 4B, as shown on a left-sided ESD protection pattern 202, the first metal via 126a may not be automatically ruptured when the over-current electrostatic discharge is introduced into the side surface 124as of the first metal pattern 124a. Even in this case, at least the second metal via 126b may be automatically ruptured to protect the semiconductor integrated circuit 114 from the over-current electrostatic discharge. Alternatively, as shown on a right-sided ESD protection pattern 202, the first metal via 126a automatically may be ruptured due to the introduction of the over-current electrostatic discharge, but metallic constituents of the ruptured first metal via 126a may aggregate to form a first metal via mass 126am. In this case, at least the second metal via 126b may be automatically ruptured to protect the semiconductor integrated circuit 114 from the over-current electrostatic discharge. The automatic rupture of the second metal via 126b on the right-sided ESD protection pattern 202 may occur either simultaneously with the formation of the first metal via mass 126am or when the over-current electrostatic discharge is subsequently introduced into the side surface 124as of the first metal pattern 124a.

FIGS. 5A to 5F are diagrams of structures protecting semiconductor devices from electrostatic discharge according to exemplary embodiments of inventive concepts.

Figure 5A:
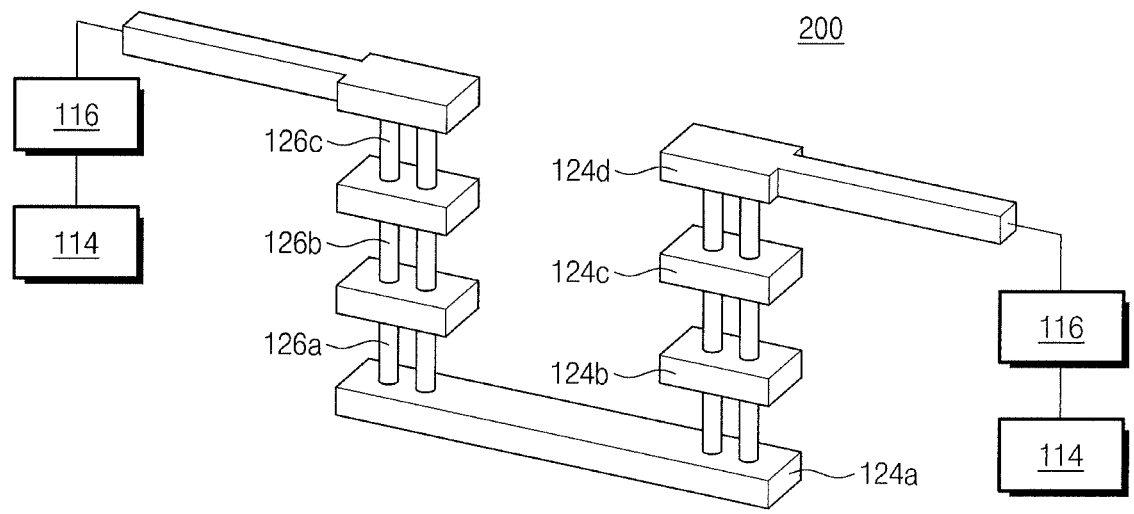
FIGS. 5A to 5F are schematic illustrations of structures protecting semiconductor devices from an electrostatic discharge according to exemplary embodiments of inventive concepts.

Referring to FIG. 5A, the test signal input structure 200 may have a dual metal via structure formed by the processes discussed in FIGS. 2A and 2B. For example, each of the first to third metal vias 126a to 126c may be formed to have a dual structure including two metal vias in parallel with one another. For another example, each of the first to third metal vias 126a to 126c may be formed to have a multiple structure including three or more metal vias. For still another example, the first metal via 126a may be formed to have a dual or multiple structure, and the second and third metal vias 126b and 126c may be formed to have a single structure as illustrated in FIG. 4A.

Figure 5B:
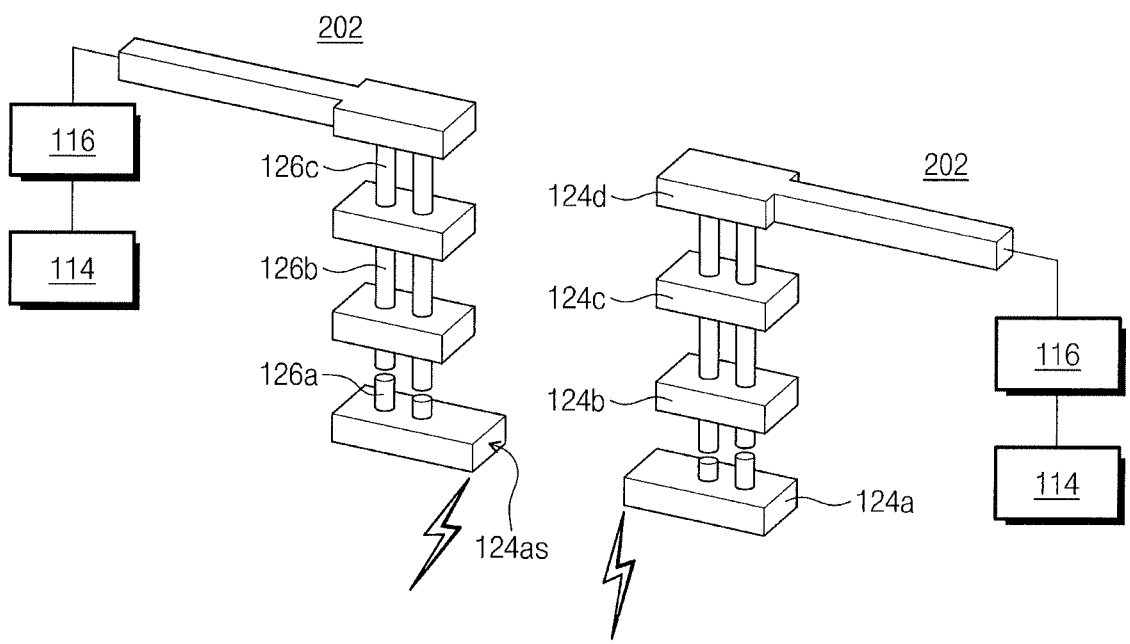

Referring to FIG. 5B, the ESD protection pattern 202 may be formed to include the first to third metal vias 126a to 126c each having a dual structure formed by the dicing process discussed in FIG. 2C. When the over-current electrostatic discharge is introduced into the side surface 124as of the first metal pattern 124a, at least the first metal via 126a may be automatically ruptured.

Figure 5C:
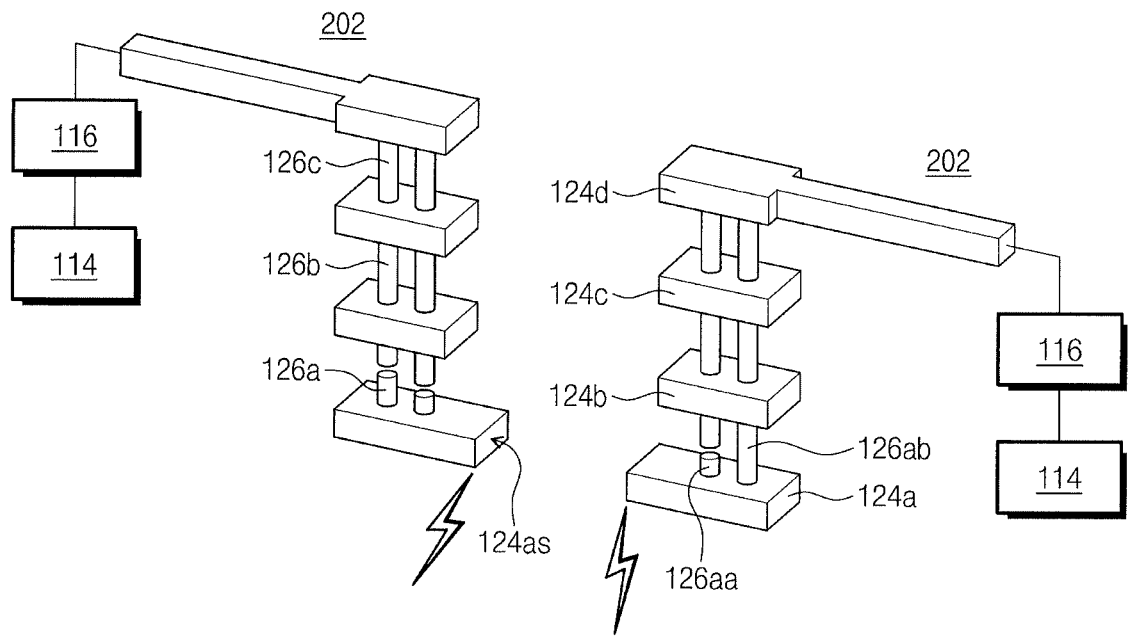
Figure 5D:
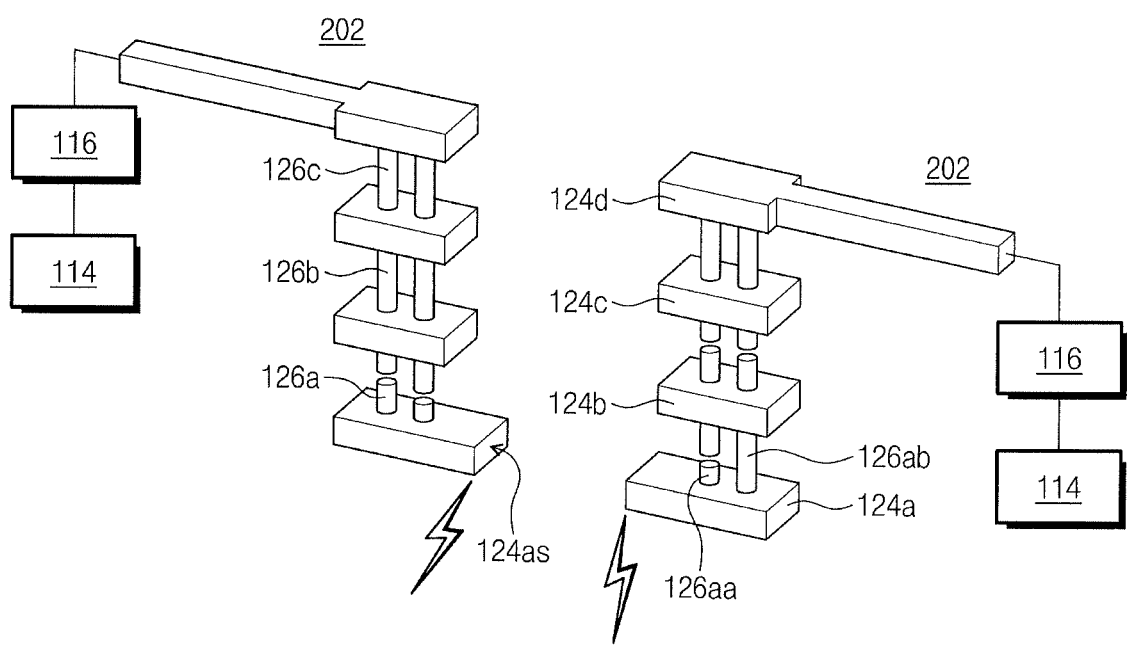

Referring to FIG. 5C, as shown on a right-sided ESD protection pattern 202, a metal via 126aa of the dual-type first metal via 126a may be selectively automatically ruptured when the over-current electrostatic discharge is introduced into the side surface 124as of the first metal pattern 124a, but other metal via 126ab of the dual-type first metal via 126a may not be automatically ruptured. In this case, although the over-current electrostatic discharge flows passing through the right-sided ESD protection pattern 202, the ESD protection circuit 116 may protect the semiconductor integrated circuit 114 from the over-current electrostatic discharge. For another example, in the case that the metal via 126aa is automatically ruptured but the other metal via 126ab is not automatically ruptured, the over-current electrostatic discharge that has flowed through the ruptured metal via 126aa may change its flowing direction from the ruptured metal via 126aa into the non-ruptured metal via 126ab. Therefore, the metal via 126ab may be automatically ruptured at substantially the same time when the metal via 126aa automatically is ruptured, as shown in FIG. 5B. For still another example, even though the metal via 126ab is not automatically ruptured, as shown in FIG. 5D, the second metal via 126b may be automatically ruptured either at substantially the same time when the metal via 126aa is automatically ruptured or at the time when the over-current electrostatic discharge is subsequently introduced into the side surface 124as of the first metal pattern 124a.

Figure 5E:
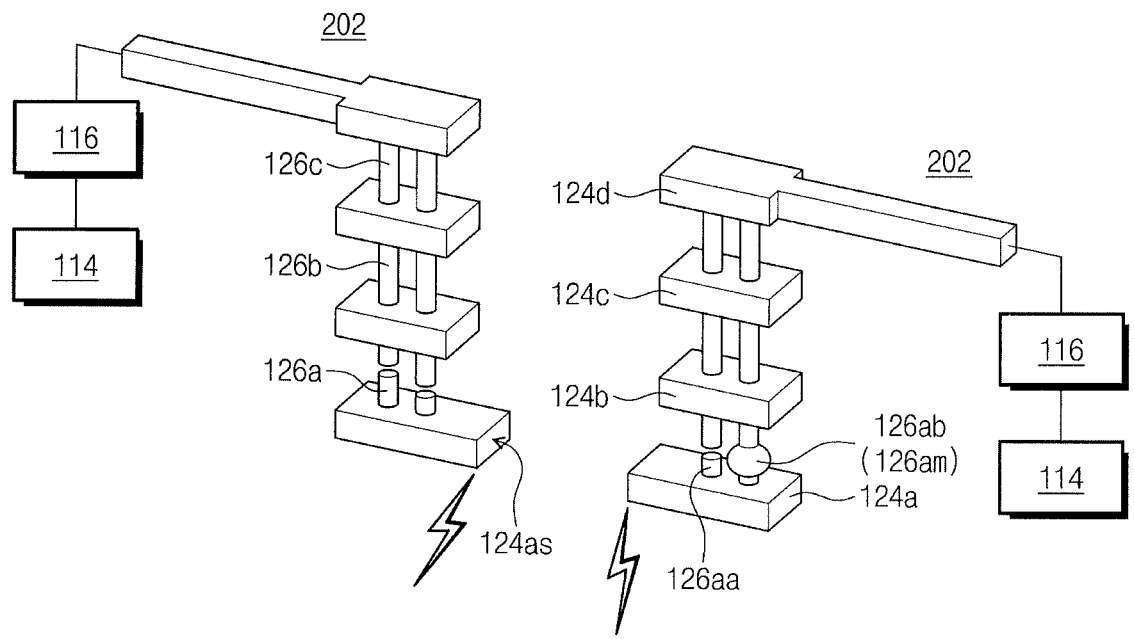
Figure 5F:
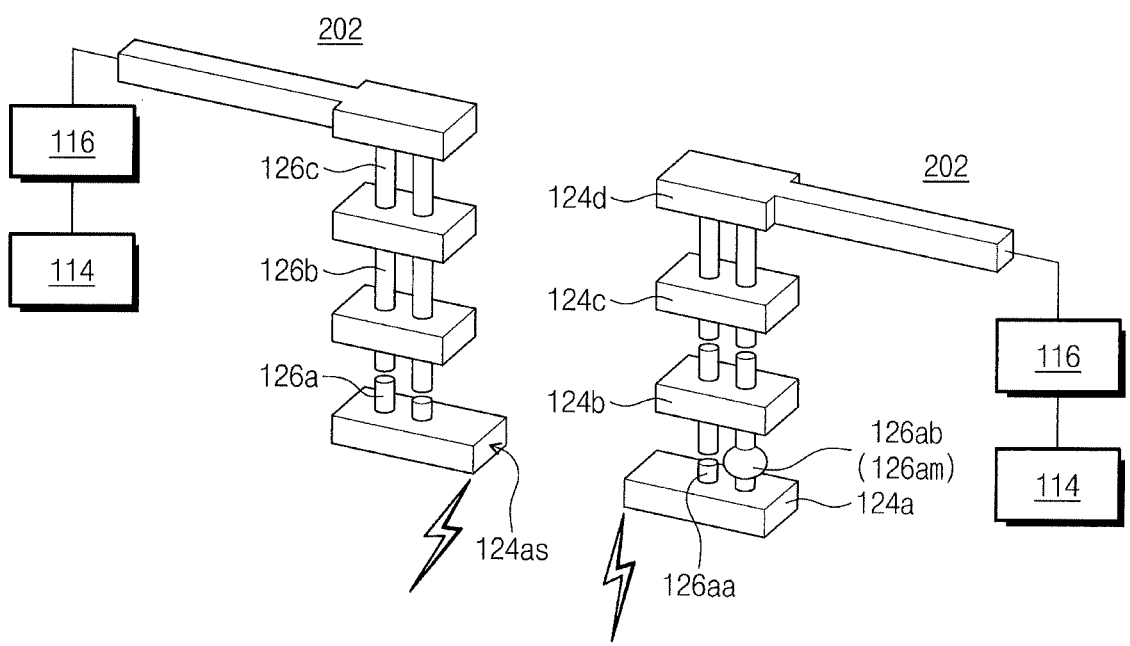

Referring to FIG. 5E, as shown on a right-sided ESD protection pattern 202, a metal via 126aa of the dual-type first metal via 126a may be automatically ruptured and other metal via 126ab of the dual-type first metal via 126a may be formed into the first metal via mass 126am. In this case, as illustrated in FIG. 5F, the second metal via 126b of the right-sided ESD protection pattern 202 may be automatically ruptured either at substantially the same time when the first metal via mass 126am is formed or at the time when the over-current electrostatic discharge is subsequently introduced into the side surface 124as of the first metal pattern 124a.

Figure 6A:
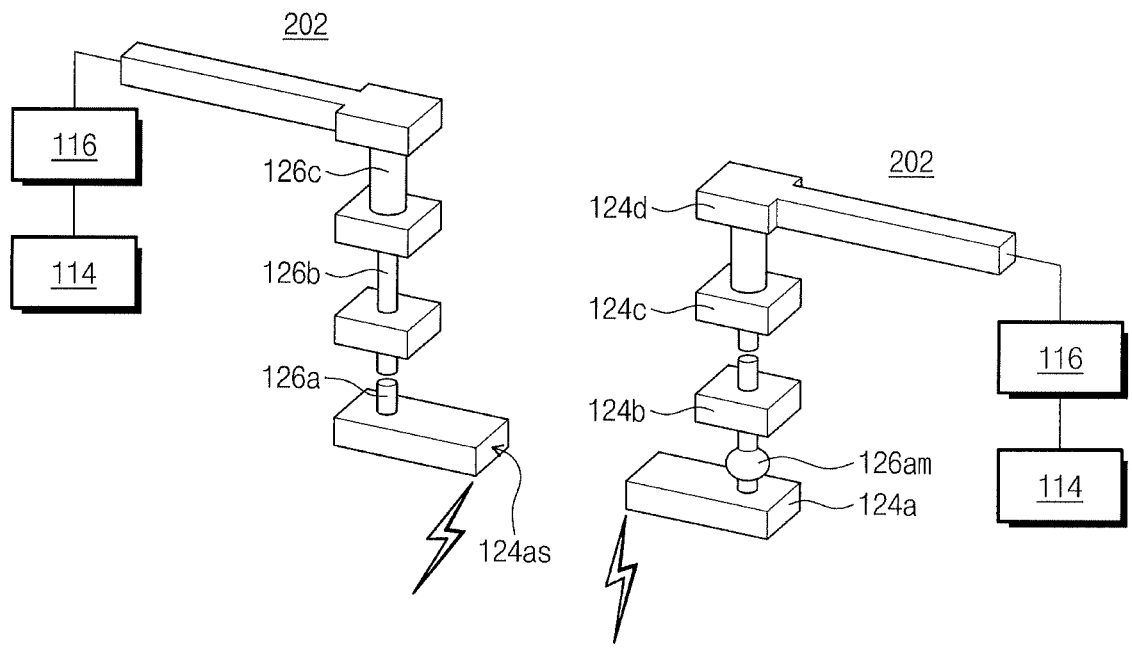
FIGS. 6A and 6B illustrate conceptual diagrams showing a principle of protecting semiconductor devices from an electrostatic discharge according to exemplary embodiments of inventive concepts.
Figure 6B:
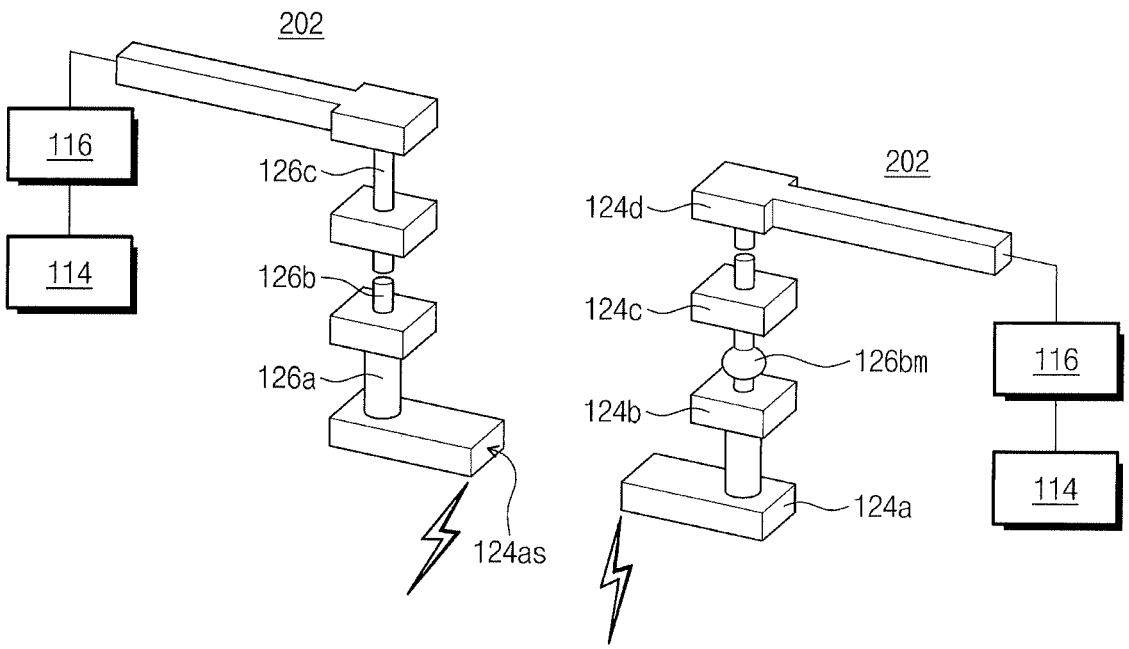

FIGS. 6A and 6B illustrate structures protecting semiconductor devices from electrostatic discharge according to exemplary embodiments of inventive concepts.

Referring to FIG. 6A, of the first to third metal vias 126a to 126c included in the ESD protection pattern 202, the third metal via 126c may have a diameter greater than those of the first and second metal vias 126a and 126b. For example, each of the first and second metal vias 126a and 126b may have a diameter (or cross-sectional area) that can endure a test voltage/current or a lower voltage/current than the test voltage/current, and the third metal via 126c may have a diameter greater than that of each of the first and second metal vias 126a and 126b. When the over-current electrostatic discharge is introduced into the side surface 124as of the first metal pattern 124a, at least one of the first and second metal vias 126a and 126b may be automatically ruptured. Even when the first and second metal vias 126a and 126b are not automatically ruptured or when the first metal via mass 126am is formed, the third metal via 126c may be automatically ruptured. Although all of the first to third metal vias 126a to 126c are not automatically ruptured, the ESD protection circuit 116 may protect the semiconductor integrated circuit 114 from the over-current electrostatic discharge.

Referring to FIG. 6B, of the first to third metal vias 126a to 126c included in the ESD protection pattern 202, the first metal via 126a may have a diameter greater than those of the second and third metal vias 126b and 126c. When the over-current electrostatic discharge is introduced into the side surface 124as of the first metal pattern 124a, the first metal via 126a may be automatically ruptured. Alternatively, although the first metal via 126a is not automatically ruptured, at least one of the second and third metal vias 126b and 126c may be automatically ruptured. As shown on a right-sided ESD protection pattern 202, the first metal via 126a may not be automatically ruptured, and the second metal via 126b may be automatically ruptured to form a second metal via mass 126bm instead of being divided into pieces. In this case, the third metal via 126c may be automatically ruptured.

Figure 7A:
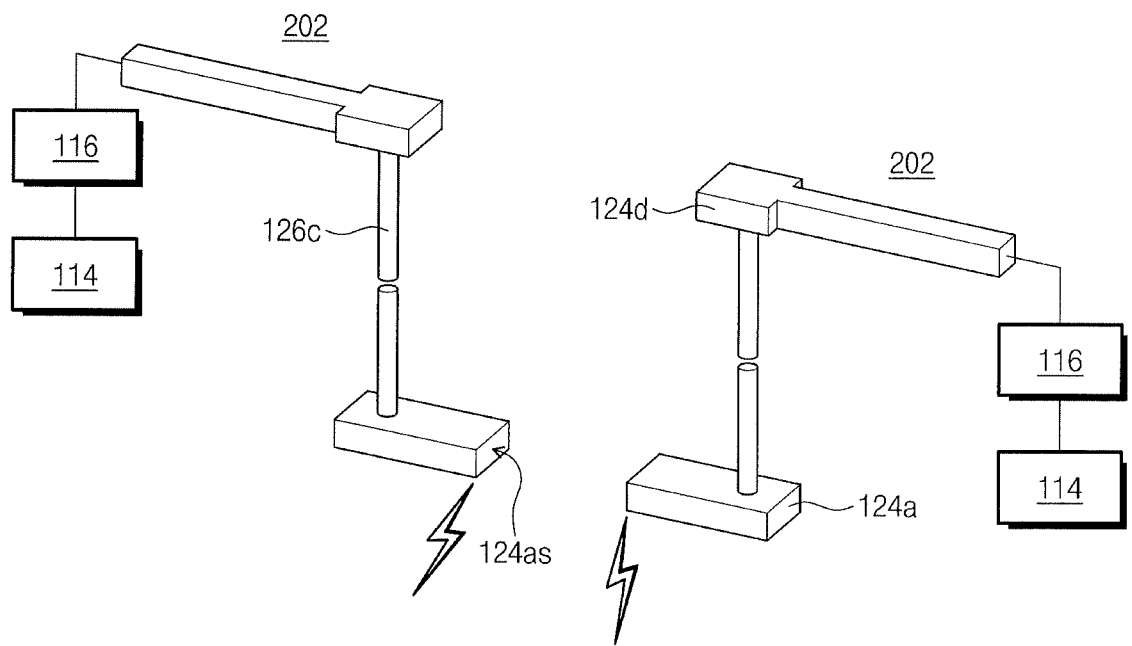
FIGS. 7A and 7B are schematic illustrations of structures protecting semiconductor devices from an electrostatic discharge according to exemplary embodiments of inventive concepts.
Figure 7B:
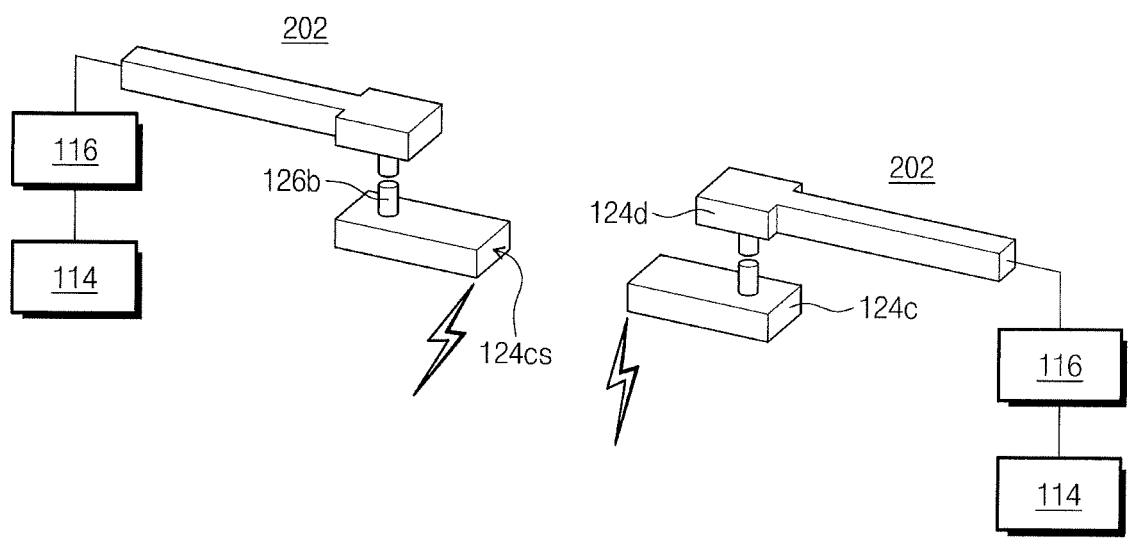

FIGS. 7A and 7B illustrate structures protecting semiconductor devices from electrostatic discharge according to exemplary embodiments of inventive concepts.

Referring to FIG. 7A, the ESD protection pattern 202 may be formed to have a single metal via structure in which the third metal via 126c is placed between the first metal pattern 124a and the fourth metal pattern 124d. For example, when forming the test signal input structure 200 discussed with reference to FIGS. 2A and 2B, the first and second metal vias 126a and 126b and the second and third metal patterns 124b and 124c may not be formed, and the third metal via 126c may be formed to penetrate the first to third intermetal dielectric layers 122a to 122c. In this case, the third metal via 126c may be formed to have a pillar shape that continuously extends between the first metal pattern 124a and the fourth metal pattern 124d. When the over-current electrostatic discharge is introduced into the side surface 124as of the first metal pattern 124a, the third metal via 126c may be automatically ruptured to protect the semiconductor integrated circuit 114 from the over-current electrostatic discharge.

Referring to FIG. 7B, the ESD protection pattern 202 may be formed to have a single metal via structure in which the third metal via 126c is placed between the third metal pattern 124c and the fourth metal pattern 124d. For example, when forming the test signal input structure 200 discussed with reference to FIGS. 2A and 2B, the first and second metal patterns 124a and 124b and the first and second metal vias 126a and 126b may not be formed, and the third metal pattern 124c may be formed to have a continuous linear shape running across the scribe lane 101. In this case, the third metal pattern 124c may be cut to expose its side surface 124cs when the dicing process of FIG. 2C is performed. When the over-current electrostatic discharge is introduced into the side surface 124cs of the third metal pattern 124c, the third metal via 126c may be automatically ruptured to protect the semiconductor integrated circuit 114 from the over-current electrostatic discharge.

The embodiments disclosed in this description are not mutually exclusive, but can be combined with each other in various ways. For example, the dual-type first to third metal vias 126a to 126c of FIG. 5A may have different diameters from each other as shown in FIGS. 6A or 6B. For another example, the dual-type first metal via 126a of FIG. 5A may include metal vias having different diameters from each other.

As illustrated in FIG. 2D, the semiconductor device 10 may further include the ESD protection circuit 116 and the ESD protection pattern 202 as well. In addition, the ESD protection pattern 202 may include at least one of the first to third metal vias 126a to 126c that can be automatically ruptured, thereby actively and reliably protecting the semiconductor device 10 from electrostatic discharge. The ESD protection pattern 202 may protect the semiconductor device 10 from not only electrostatic discharge, but any electrical shock occurred in manufacturing the semiconductor device 10.

In this description, the term "metal" means any metallic material (e.g., copper, tungsten, or aluminum) and also covers any conductive material (e.g., impurity-doped silicon, undoped or intrinsic silicon, conductive metal nitride, or metal silicide). Therefore, a metal pattern and a conductive pattern may have substantially the same meaning. In some embodiments, the ESD protection pattern can include any material that may be configured (i.e., using specified material and physical dimensions such as cross-sectional area) to breakdown in response to an ESD that exceeds a predetermined threshold so that the ESD protection pattern becomes non-conducting. It will be understood that ESD protection patterns do not include an active circuit.

According to inventive concepts, the semiconductor device may have the ESD protection pattern having enforced protecting capability, and may thus be free of any electrical shock occurred in manufacturing the semiconductor device. As a result, it may be possible to accomplish semiconductor devices having excellent electrical characteristics and methods of manufacturing the same.

This detailed description of inventive concepts should not be construed as limited to the embodiments set forth herein, and it is intended that inventive concepts cover the various combinations, the modifications and variations of this invention without departing from the spirit and scope of inventive concepts. The appended claims should be construed to include other embodiments.

What is claimed:

1. A semiconductor device, comprising:
a front-end-of-line region, at least a portion of which is disposed on a substrate, the front-end-of-line region including an electrostatic discharge protection circuit and an integrated circuit electrically connected to the electrostatic discharge protection circuit;
a back-end-of-line region on the front-end-of-line region; and
an electrostatic discharge protection pattern on a scribe region of the substrate,
wherein the electrostatic discharge protection pattern comprises:
a lower pattern extending horizontally and having a side cross-sectional surface defined by a height and a width of the lower pattern, the side cross-sectional surface exposed through a side surface of the back-end-of-line region;
a via electrically connected to the lower pattern and extending perpendicularly to the substrate; and
an upper pattern electrically connected to the via.

2. The device of claim 1, wherein the upper pattern comprises a redistribution pattern extending horizontally.

3. The device of claim 1, wherein the via and the upper pattern are spaced apart from a side surface of the back-end-of-line region.

4. The device of claim 1, wherein the lower pattern has no directly physical and electrical connection with the substrate.

5. The device of claim 1, wherein the electrostatic discharge protection pattern is electrically connected through the upper pattern to the electrostatic discharge protection circuit.

6. The device of claim 1, wherein the electrostatic discharge protection pattern further comprises an intermediate pattern between the upper pattern and the lower pattern and buried completely within the back-end-of-line region.

7. The device of claim 6, wherein the via comprises:
a first via between the lower pattern and the intermediate pattern; and
a second via between the intermediate pattern and the upper pattern,
wherein the first and second vias are buried completely within the back-end-of-line region.

8. The device of claim 1, wherein
the upper pattern has a linear shape extending in a direction away from a side surface of the back-end-of-line region, and
the lower pattern has a linear shape extending toward the side surface of the back-end-of-line region.

9. The device of claim 8, wherein
the upper pattern is spaced apart from the side surface of the back-end-of-line region, and
the side surface of the lower pattern is coplanar with the side surface of the back-end-of-line region.

10. The device of claim 1, wherein the via is automatically ruptured when receiving an electrical shock greater than a test voltage or a test current applied to the integrated circuit.

11. A semiconductor device, comprising:
a semiconductor integrated circuit at least a portion of which is disposed on a substrate;
an electrical connection region on the semiconductor integrated circuit and having a side surface in a scribe region of the substrate, the side surface being coplanar with a side surface of the substrate; and
an electrical protection pattern disposed in a side portion of the electrical connection region,
wherein the electrical protection pattern comprises:
a lower pattern extending along the substrate and including an exposed portion exposed through the side surface of the electrical connection region;
a via electrically connected to the lower pattern and configured to be automatically ruptured by an electrical discharge greater than a specified charge associated with an electrical test voltage applied to the semiconductor integrated circuit; and
an upper pattern electrically connected to the via and not exposed through the side surface of the electrical connection region.

12. The device of claim 11, wherein the upper pattern has a linear shape extending in a direction away from the side surface of the electrical connection region.

13. The device of claim 11, wherein the upper pattern has a pad shape spaced apart from the side surface of the electrical connection region.

14. The device of claim 11, wherein the via has a pillar shape spaced apart from the side surface of the electrical connection region and extending between the lower pattern and the upper pattern in a direction along the side surface of the electrical connection region.

15. The device of claim 11, wherein the electrical protection pattern further comprises an intermediate pattern between the lower pattern and the upper pattern and spaced apart from the side surface of the electrical connection region.

16. The device of claim 15, wherein the via comprises:
a first via having a pillar shape between the lower pattern and the intermediate pattern and extending along the side surface of the electrical connection region; and
a second via having a pillar shape between the intermediate pattern and the upper pattern and extending along the side surface of the electrical connection region,
wherein the first and second vias are automatically ruptured by the electrical discharge.

17. The device of claim 16, wherein the first and second vias have equal diameter or different diameters.

18. The device of claim 11, further comprising an electrostatic discharge protection circuit disposed near the scribe region of the substrate and electrically connected to the semiconductor integrated circuit,
wherein the upper pattern is electrically connected through the electrical connection region to the electrostatic discharge protection circuit.

19. The device of claim 11, wherein the upper pattern provides an input terminal to which the electrical test voltage is applied when an electrical test is performed on the semiconductor integrated circuit.

20. The device of claim 11, wherein the lower pattern and the via form an L shape.

* * * * *